(12) United States Patent
Wada

(10) Patent No.: US 6,490,710 B1
(45) Date of Patent: Dec. 3, 2002

(54) LOGIC VERIFICATION METHOD AND APPARATUS FOR LOGIC VERIFICATION

(75) Inventor: Yasushi Wada, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 106 days.

(21) Appl. No.: 09/630,412

(22) Filed: Aug. 1, 2000

(30) Foreign Application Priority Data

Apr. 6, 2000 (JP) ........................................ 2000-104836

(51) Int. Cl.[7] ................................................ G06F 17/50
(52) U.S. Cl. ................................. 716/5; 716/3; 716/4
(58) Field of Search .............................. 716/5, 1–14

(56) References Cited

U.S. PATENT DOCUMENTS

| | | | | | |
|---|---|---|---|---|---|
| 5,243,538 A | * | 9/1993 | Okuzawa et al. | ............... | 716/5 |
| 5,671,399 A | * | 9/1997 | Meier | ............................ | 716/5 |
| 5,754,454 A | * | 5/1998 | Pixley et al. | ................ | 716/123 |
| 5,867,396 A | * | 2/1999 | Parlour | ......................... | 716/18 |
| 5,909,374 A | * | 6/1999 | Matsunaga | .................... | 716/19 |
| 5,949,691 A | * | 9/1999 | Kurosaka et al. | ............... | 716/5 |

FOREIGN PATENT DOCUMENTS

| JP | 8-94714 | 4/1996 |
|---|---|---|
| JP | 9-146991 | 6/1997 |

* cited by examiner

Primary Examiner—Vuthe Siek
Assistant Examiner—Sun James Lin
(74) Attorney, Agent, or Firm—Leydig, Voit & Mayer, Ltd.

(57) ABSTRACT

After a logic verification is made in a low-hierarchical block, a logic verification is made in a high-hierarchical block circuit in a state that the low-hierarchical block is not the subject of comparison. Even if the number of input ports in the low-hierarchical block increases due to a change of the circuit, logical equivalence of the high-hierarchical circuit is verified by using equivalence information of the input ports.

6 Claims, 7 Drawing Sheets

FIG.4
LOW-HIERARCHICAL BLOCK Y
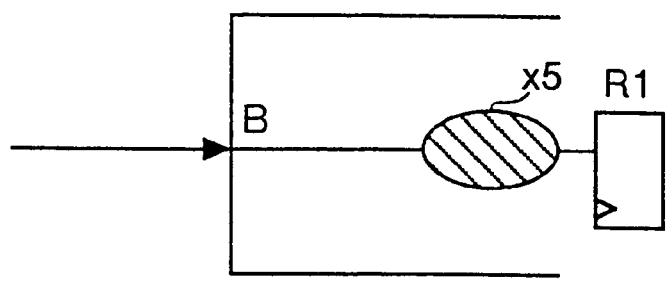
LOW-HIERARCHICAL BLOCK Y'
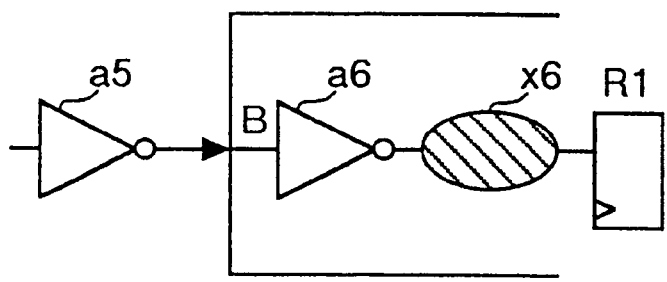

FIG.6
CIRCUIT Z
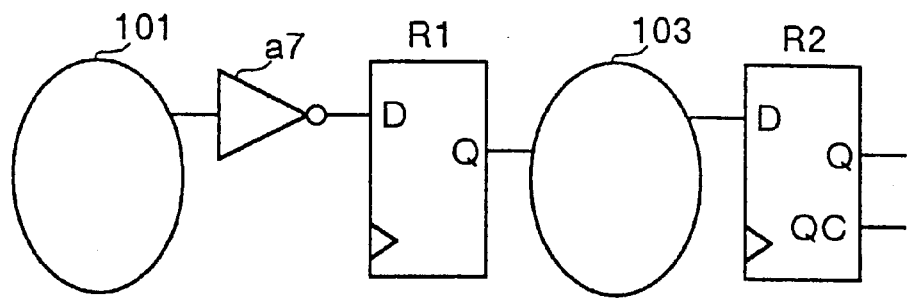
CIRCUIT Z'
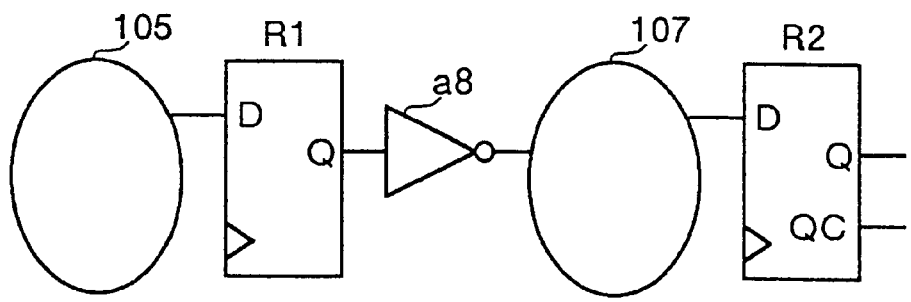

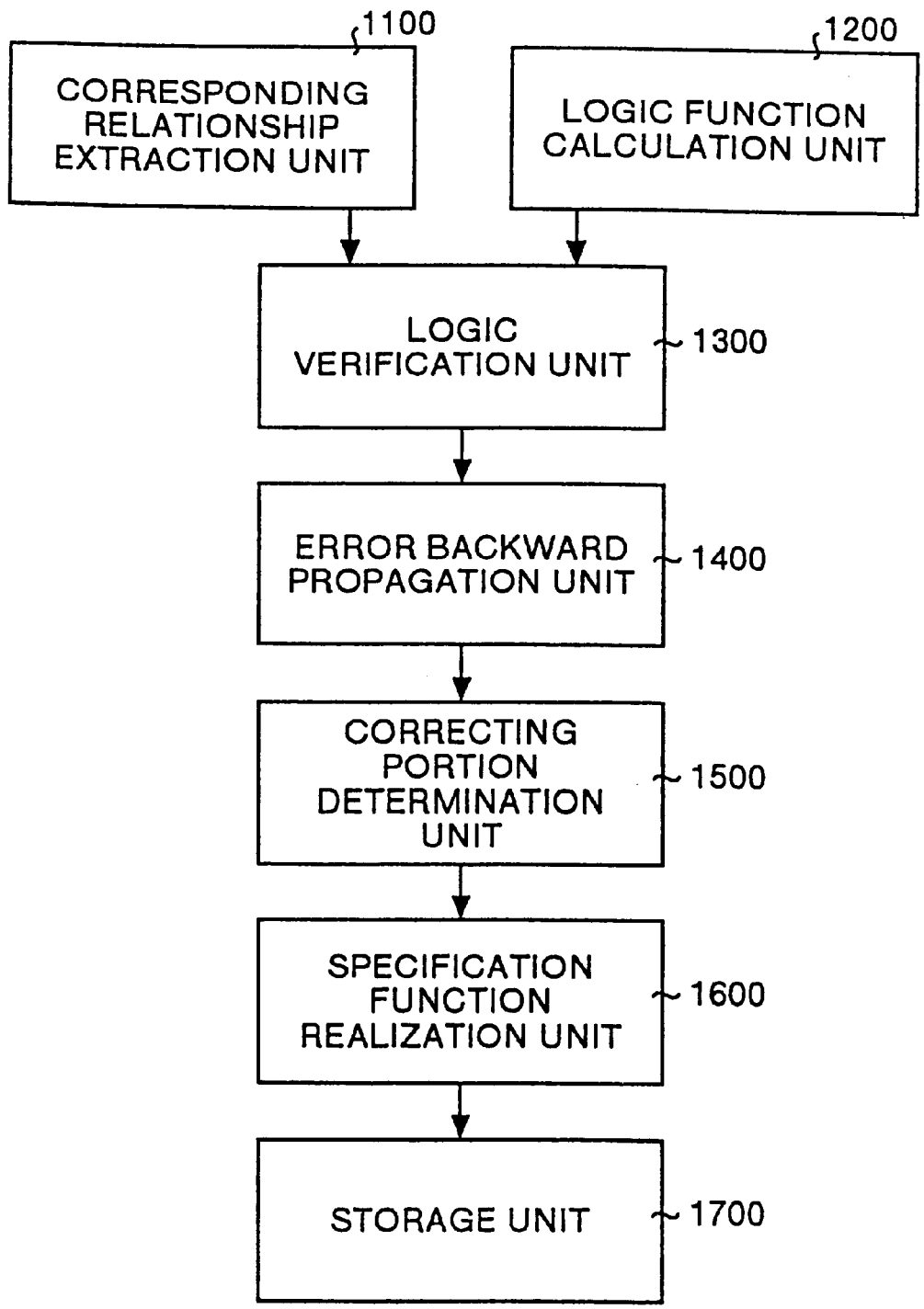

LOGIC VERIFICATION METHOD AND APPARATUS FOR LOGIC VERIFICATION

FIELD OF THE INVENTION

The present invention relates to a logical verification of a circuit. More particularly, this invention relates to logic verification method and apparatus.

BACKGROUND OF THE INVENTION

In the case of a circuit for which circuit information (net list) is arranged hierarchically is changed, although the whole circuit is equivalent logically, input ports may increase and the logic maybe inverted occasionally in a low-hierarchical block.

For example, FIG. 8 is a block diagram showing a conventional logic verification method disclosed in Japanese Patent Application Laid-Open No. 9-146991. With reference to FIG. 8, a corresponding relationship extraction unit 1100 extracts a corresponding relationship of output ports from a low-hierarchical block or input ports to the low-hierarchical block in a logic circuit before and after changing a circuit (hereinafter, old logic circuit and new logic circuit).

Further, a logic function calculation unit 1200 calculates a logic function of the input ports or output ports in the old and new logic circuits. A logic verification unit 1300 judges logic equivalence in the input ports of the old and new logic circuits according to the corresponding relationship extracted by the corresponding relationship extraction unit 1100.

In addition, in the case where the logic functions of the input ports in the old and new logic circuits are different from each other, as the result of the judgment in the logic verification unit 1300, an error backward propagation unit 1400 makes calculations from the input port in the old logic circuit to the backward side so as to be equivalent to the logic functions of the input ports in the new logic circuit.

A correcting portion determination unit 1500 determines a correcting portion of the old logic circuit based on the calculated result in the error backward propagation unit 1400. A specification function implementation unit 1600 implements a specification function of the correcting portion. A storage unit 1700 stores a portion which is not corrected in the old logic circuit.

When the logic equivalence is verified by using a logic verification method where the old and new logic circuits which have been changed logically can be realized hierarchically, the number of the input ports in the low-hierarchical blocks and the logic in the input ports are different. As a result, correct comparison cannot be made.

SUMMARY OF THE INVENTION

One aspect of the invention provides logic verification method and apparatus which make a logic verification in a low-hierarchical block, make a logic verification in a high-hierarchical circuit in a state that the low-hierarchical block is not subject of comparison, and even if a number of comparison points in the low-hierarchical block increases due to the change of the circuit, verify logical equivalence in the high-hierarchical circuit using equivalence information of the comparison points in the method of verifying logical equivalence before and after a change of a circuit in which circuit information is composed hierarchically.

Further, another aspect of the invention provides a logic verification method, of verifying logical equivalence before and after a change of a circuit in which circuit information is composed hierarchically, which includes the steps of: judging that a number of input ports in first and second low-hierarchical blocks is different and recognizing that a second input port in the second low-hierarchical block is left; executing backward retrieval from the second input port in the second low-hierarchical block based on the circuit information until a branch point is found; finding the branch point as a result of the backward retrieval; when the branch point is found, executing forward retrieval from the branch point; finding a first input port in the second low-hierarchical block as a result of the forward retrieval; judging as to whether or not the first and second input port in the second low-hierarchical block are equivalent logically to each other using circuit information of the first and second input ports in the second low-hierarchical block; when first and second ports are equivalent logically, regarding that the first and second input ports in the second low-hierarchical block are equal to each other; and when the first and second ports are not equivalent logically, returning to the step of executing the forward retrieval from the branch point.

Further, still another aspect of the invention provides a logic verification method, of verifying logical equivalence before and after a change of a circuit in which circuit information is composed hierarchically, which includes the steps of: when non-equivalence occurs at first comparison points in first and second low-hierarchical blocks, analyzing the non-equivalence at the first comparison points in the first and second low-hierarchical blocks; finding second comparison points in the first and second low-hierarchical blocks as a cause of the non-equivalence; inverting the second comparison points in the first and second low-hierarchical blocks so as to again compare logic of the first comparison points in the first and second low-hierarchical blocks; judging as to whether or not the logic is equivalent at the first comparison points in the first and second low-hierarchical blocks; when the logic is not equivalent, regarding the non-equivalence at the first comparison points in the first and second low-hierarchical blocks as true non-equivalence; when the logic is equivalent, creating information that second comparison points in the first and second low-hierarchical blocks establish an inverted relationship so as to compare logic in high-hierarchical block or another equal-hierarchical block at the second points in the first and second low-hierarchical blocks using the information; judging as to whether or not the logic is equivalent at the second comparison points in the first and second low-hierarchical blocks; when the logic is not equivalent, regarding the non-equivalence at the second comparison points in the first and second low-hierarchical blocks as true non-equivalence; and when the logic is equivalent, regarding the non-equivalence at the second comparison points in the first and second low-hierarchical blocks as false non-equivalence.

Further, still another aspect of the invention provides a logic verification method, of verifying logical equivalence before and after a change of a circuit in which circuit information is composed hierarchically, which includes the steps of: when non-equivalence occurs at first comparison points in first and second equal-hierarchical blocks, inverting the first comparison points in the first and second equal-hierarchical blocks so as to make a comparison; judging as to whether or not logic is equivalent at the first comparison points in the first and second equal-hierarchical blocks; when the logic is not equivalent, regarding the non-equivalence at the first comparison points in the first and second equal-hierarchical blocks as true non-equivalence; when the logic is equivalent, comparing second comparison points in the first and second equal-hierarchical blocks; judging as to whether or not the logic is equivalent at the second comparison points in the first and second equal-hierarchical blocks; when the logic is not equivalent, again comparing logic at the second comparison points in the first and second equal-hierarchical blocks using a condition that the first comparison point in the first equal-hierarchical block is not the first comparison point in the second equal-hierarchical block; when the logic is equivalent, regarding the non-equivalence at the first comparison points in the first and second equal-hierarchical blocks as true non-equivalence; judging as to whether or not logic is equivalent at the second comparison points in the first and second equal-hierarchical blocks; when the logic is not equivalent, regarding the non-equivalence at the first comparison points in the first and second equal-hierarchical blocks as true non-equivalence; and when the logic is equivalent, regarding the non-equivalence at the first comparison points in the first and second equal-hierarchical blocks as false non-equivalence.

Further, still another aspect of the invention provides a logic verification apparatus, for verifying logical equivalence before and after a change of a circuit in which circuit information is composed hierarchically, which includes means for making a logic verification in a low-hierarchical block, making a logic verification in a high-hierarchical circuit in a state that the low-hierarchical block is not the subject of comparison, and even if a number of comparison points in the low-hierarchical block increases due to the change of the circuit, verifying logical equivalence in the high-hierarchical circuit using equivalence information of the comparison points.

Further, still another aspect of the invention provides a logic verification apparatus, for verifying logical equivalence before and after a change of a circuit in which circuit information is composed hierarchically, which includes means for making a verification by means of the logic verification method according to any one of the above-mentioned aspects.

Other objects and features of this invention will become apparent from the following description with reference to the accompanying drawings.

BRIEF DESCRIPTION OF THE DRAWINGS

FIG. 4 is a circuit diagram showing a logic verification method according to a second embodiment of the present invention.

FIG. 6 is a circuit diagram showing a logic verification method according to a third embodiment of the present invention.

FIG. 8 is a block diagram showing a conventional logic verification method.

DESCRIPTION OF THE PREFERRED EMBODIMENTS

Figure 1:
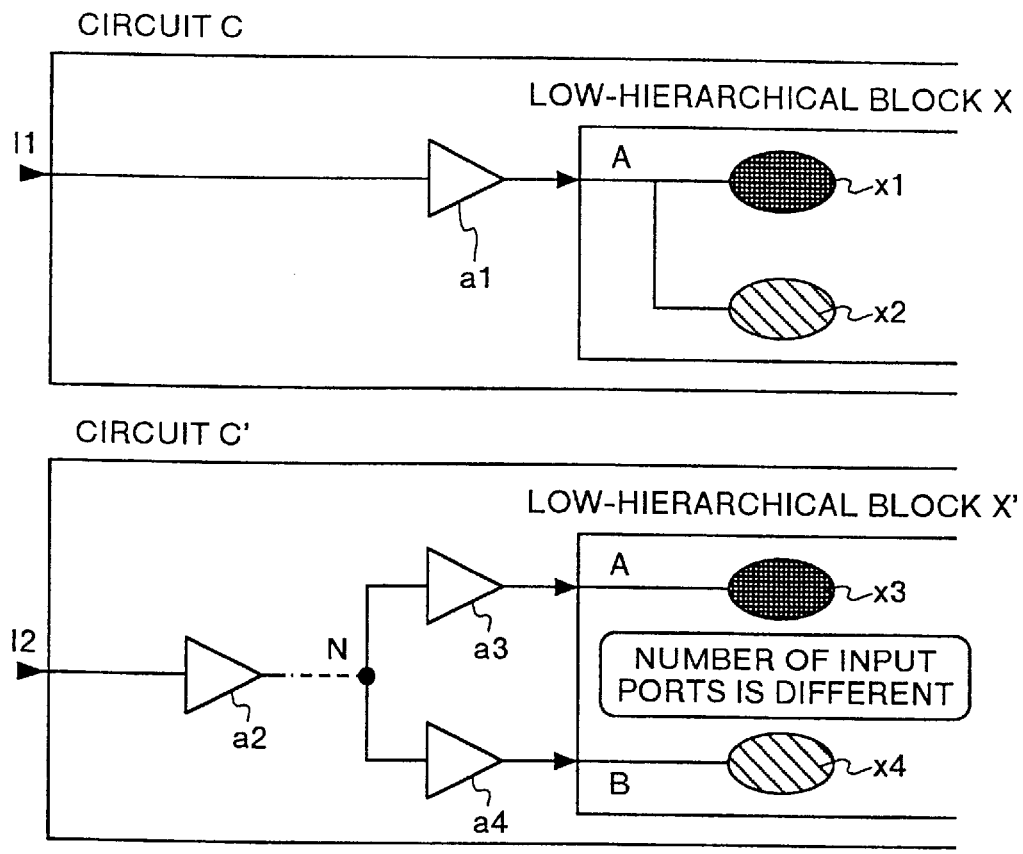
FIG. 1 is a circuit diagram showing a logic verification method according to a first embodiment of the present invention.

The present invention will be explained below. FIG. 1 is a circuit diagram showing the logic verification method according to a first embodiment. As shown in FIG. 1, a circuit C is provided with an input port I1, a signal line, a buffer a1 and a low-hierarchical block X. The signal line is connected with the input port I1. The buffer a1 is connected with the signal line. The low-hierarchical block X has an input port A into which an output signal of the buffer a1 is input. The low-hierarchical block X has an internal signal line which is connected with the input port A, and internal circuits x1 and x2 which are connected with the internal signal line.

A circuit C' is equivalent logically to the circuit C. The circuit C' is provided with an input port I2, a signal line, buffers a2, a3 and a4, and a low-hierarchical block X'. The signal line is connected with the input port I2. The buffer a2 is connected with the signal line. An output signal of the buffer a2 is input into the buffers a3 and a4. The low-hierarchical block X' has an input port A into which an output signal of the buffer a3 is input. The low-hierarchical block X' also has an input port B into which an output signal of the buffer a4 is input.

A branch point N is provided at a node of the buffers a3 and a4 into which the output signal of the buffers a2 is input. The low-hierarchical block X' has an internal signal line, an internal circuit x3, an internal signal line and an internal circuit x4. The internal signal line is connected with the input port A. The internal circuit x3 is connected with this internal signal line. The other internal signal line is connected with the input port B. The internal circuit x4 is connected with this internal signal line.

Figure 2:
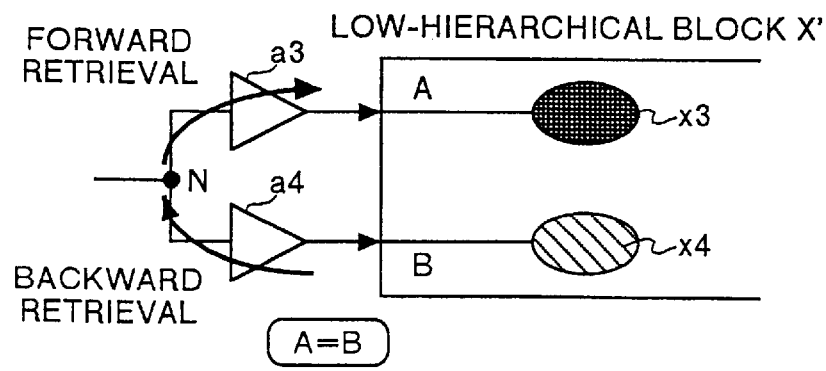
FIG. 2 is a diagram showing a of logic verification method according to the first embodiment of the present invention.

FIG. 2 is a diagram showing the steps of the logic verification method according to the first embodiment. As shown in FIG. 2, when the low-hierarchical blocks X and X' of FIG. 1 are compared with each other, the input port A exists in both the low-hierarchical blocks X and X'. The input port B exists only in the low-hierarchical block X', and the input port B is not taken.

A judgment is made that a number of the input ports is different in the low-hierarchical blocks X and X', and a recognition is made that the input port B is left. Backward retrieval from the input port B is executed until the branch point N is found based on circuit information (net list). As a result of the backward retrieval, the branch point N is found. When the branch point N is found, a forward retrieval from the branch point N is executed. As a result of the forward retrieval, the input port A in the low-hierarchical block X' is found. Gates which are passed through during the backward retrieval and forward retrieval are only buffers. The logic is not changed (inverted).

Therefore, the input ports A and B in the low-hierarchical block X' are equivalent, and when the low-hierarchical blocks X and X' are compared, the equivalent information is used. Namely, in the case where two signal lines which, are branched from a high-hierarchical block or another equal-hierarchical block by changing the circuit, are connected to one hierarchical block, the input port B does not exist in the circuit before the change. As a result, backward retrieval from the input port B is executed so that the branch point N is found. Forward retrieval from the branch point N is executed so that the input port A in the block whose hierarchy is equal to that of the input port B is found. As a result of the forward retrieval and backward retrieval, when the logic is not changed, the input ports A and B are equivalent, and this information is used when these hierarchical blocks are compared.

Figure 3:
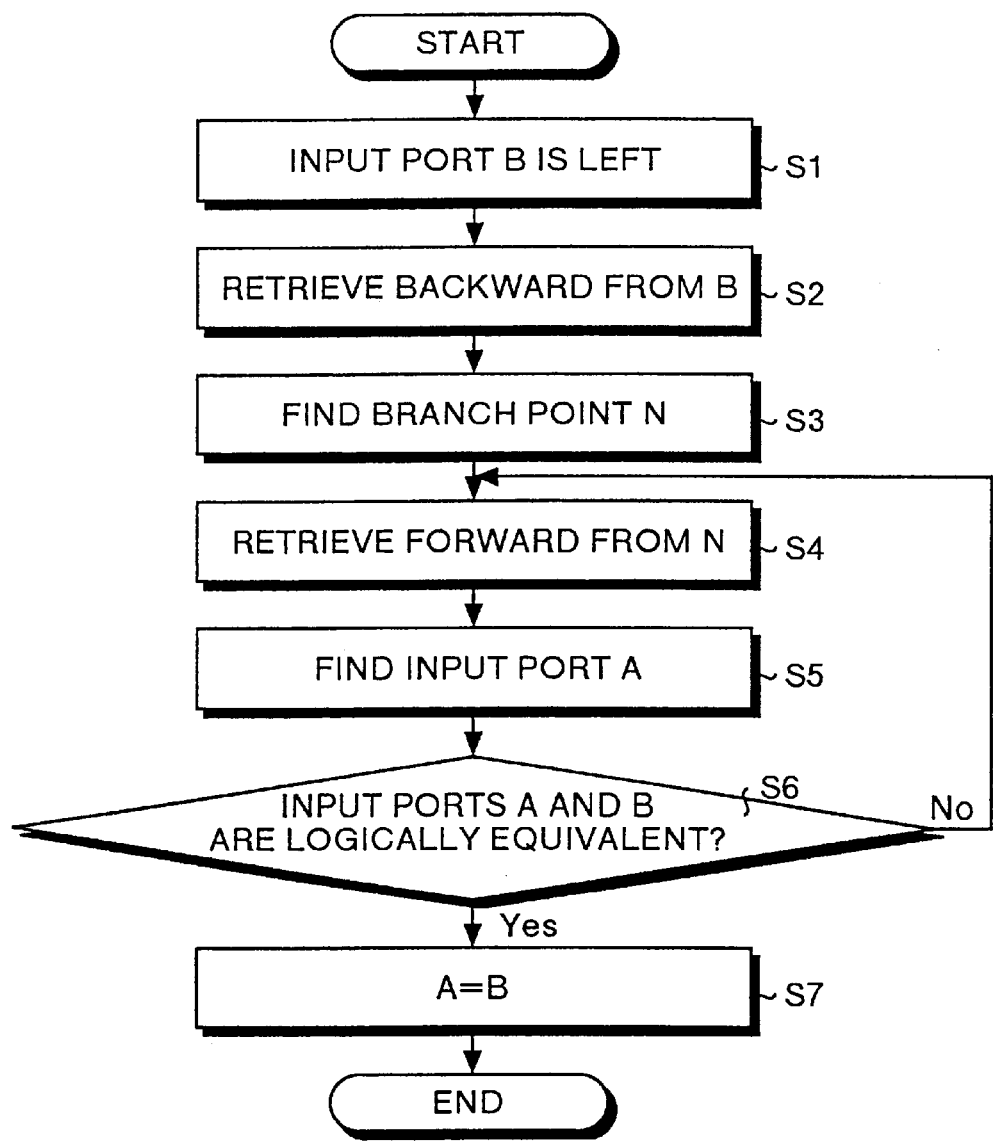
FIG. 3 is a flow chart showing a logic verification method according to the first embodiment of the present invention.

FIG. 3 is a flow chart showing the logic verification method according to the first embodiment. As shown in FIG.

3, a judgment is made that a number of the input ports is different, and a recognition is made that the input port B is left (step S1). Backward retrieval from the input port B is executed until the branch point is found based on the circuit information (net list) (step S2). As a result of the backward retrieval, the branch point N is found (step S3). When the branch point N is found, forward retrieval from the branch point N is executed (step S4).

As a result of the forward retrieval, the input port A in the low-hierarchical block X' is found (step S5). A judgment is made as to whether or not the input ports A and B are logically equivalent to each other by using the circuit information (net list) of the input port B and the circuit information (net list) of the input port A (step S6). When the decision is YES, the input port A is equal to the input port B (step S7). When the decision is NO, forward retrieval from the branch point N is executed (step S4).

According to the logic verification method according to the first embodiment, even if a number of the input ports in the low-hierarchical blocks increases due to the change of the circuit compared with the conventional logic verification method, the logic in the circuit is hardly changed (inverted) because the logical equivalence in the circuit is compared. As a result, the logical equivalence of high-hierarchical circuits can be verified correctly.

FIG. 4 is a circuit diagram showing the logic verification method according to a second embodiment. As shown in FIG. 4, a low-hierarchical block Y has an input port B, a signal line which is connected with the input port B, an internal circuit x5 which is connected with this signal line, and a register R1 which is connected with the internal circuit x5.

A low-hierarchical block Y' has an input port B, an inverter a5, a signal line, an internal inverter a6, an internal circuit x6 and a register R1. The inverter a5 inputs an inverted signal from the outside of the low-hierarchical block Y' into the input port B. The signal line is connected with the input port B. The internal inverter a6 is connected with the signal line. An inverted signal of the internal inverter a6 is input into the internal circuit x6. The register R1 is connected with the internal circuit x6.

The low-hierarchical block Y is changed like Y'. These blocks are equivalent logically to each other viewed from a high-hierarchical block. When the low-hierarchical blocks Y and Y' are compared with each other, non-equivalence (logical non-equivalence) occurs at a comparison point (register R1) Such circuits can be compared according to the sequence shown in FIG. 5.

Figure 5:
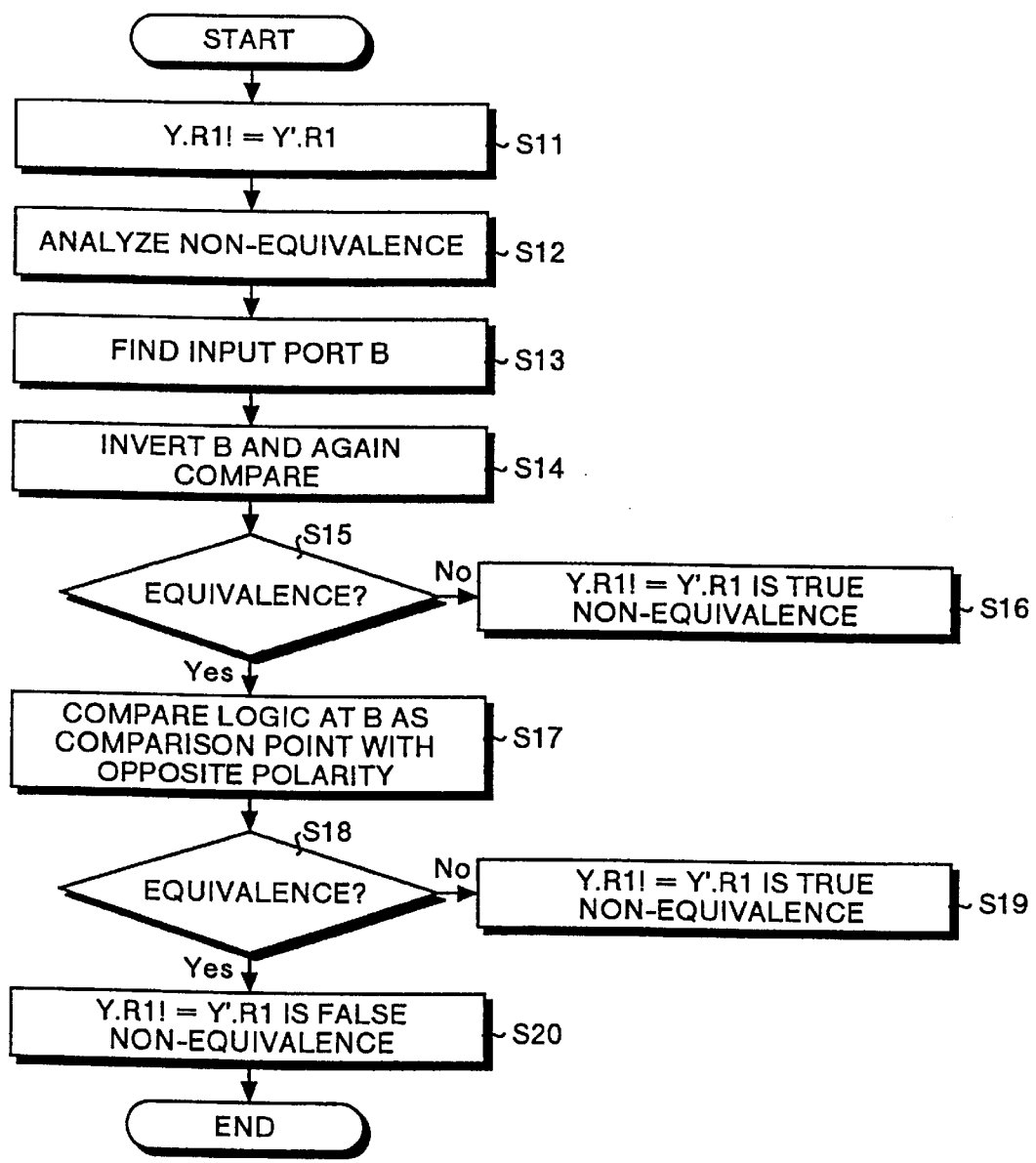
FIG. 5 is a flow chart showing a logic verification method according to the second embodiment of the present invention.

FIG. 5 is a flow chart showing the logical verification method according to the second embodiment. As shown in FIG. 5, when non-equivalence occurs at a comparison point (register R1) of the low-hierarchical block Y and at a comparison point (register R1) of the low-hierarchical block Y' (step S11), the non-equivalence is analyzed at the comparison points (registers R1) (step S12). The input ports B are found as the cause of the non-equivalence (step S13). The input ports B are inverted so that the logic at the comparison points (register R1) is again compared (step S14).

Further, a judgment is made as to whether or not the logic is equivalent to each other at the comparison points (registers R1) (step S15). When the decision is NO, the non-equivalence at the comparison points (register R1) is regarded as true non-equivalence (step S16). When the decision is YES, information that the input port B in the low-hierarchical block Y and the input port B in the low-hierarchical block Y' establish an inverted relationship is created. The logic in the high-hierarchical block or in the equivalent-hierarchical block is compared at the input ports B by using the created information (step S17).

A judgment is made as to whether or not the logic is equivalent to each other at the comparison points (input ports B) (step S18). When the decision is NO, the non-equivalence at the comparison points (input ports B) is regarded as true non-equivalence (step S19). When the decision is YES, the non-equivalence at the comparison points (input ports B) is regarded as false non-equivalence (step S20). Therefore, it is regarded that the logic at the comparison points (input ports B) are equivalent to each other.

According to the second embodiment, since the equivalence of the circuits is compared logically by using the logic verification method which can be executed more hierarchically compared with the first embodiment. For this reason, even if the logic in the circuits is inverted, the logic equivalence in the upper-hierarchical circuits can be verified correctly.

FIG. 6 is a circuit diagram showing the logic verification method according to a third embodiment. As shown in FIG. 6, a circuit Z has a combinational circuit 101, an inverter a7, a register R1, a combinational circuit 103 and a register R2. The inverter 7a is connected with the combinational circuit 101. An inverted signal of the inverter a7 is input into the register R1. An output signal of the register R1 is input into the combinational circuit 103. The register R2 is connected with the combinational circuit 103.

A circuit Z' has a combinational circuit 105, a register R1, an inverter a8, a combinational circuit 107 and a register R2. The register R1 is connected with the combinational circuit 105. An output signal of the register R1 is input into the inverter a8. An inverted signal of the inverter a8 is input into the combinational circuit 107. The register R2 is connected with the combinational circuit 107.

The operations of the circuits Z and Z' are equivalent logically. The conventional logic verification method only compares the logic of the combinational circuits between the comparison points (registers R1). The circuits Z and Z' are not equivalent logically to each other at the comparison points (registers R1 and R2). Such circuits can be compared according to the sequence shown in FIG. 7.

Figure 7:
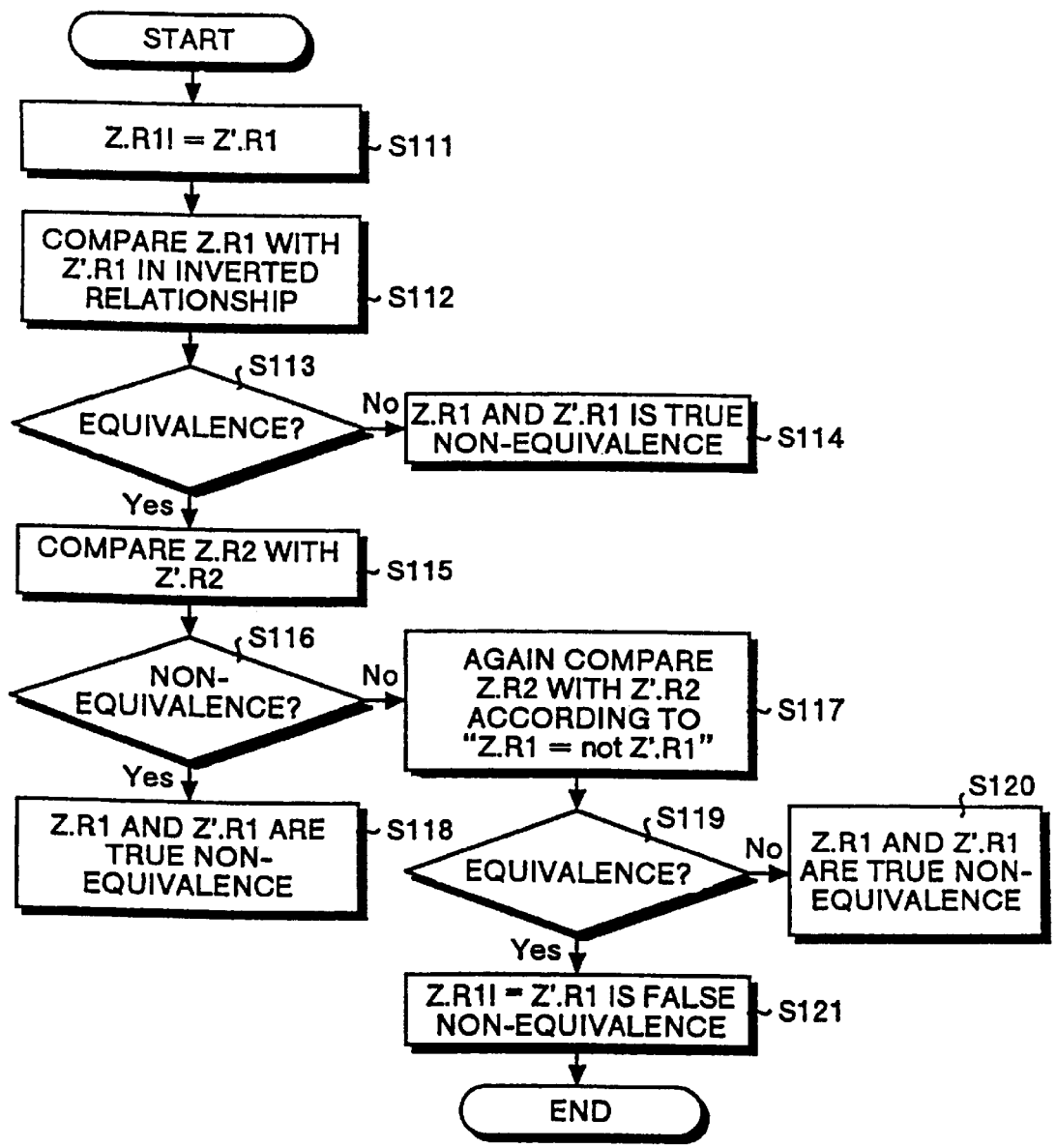
FIG. 7 is a flow chart showing a logic verification method according to the third embodiment of the present invention.

FIG. 7 is a flow chart showing the logic verification method according to a third embodiment. As shown in FIG. 7, non-equivalence occurs between the register R1 of the circuit Z and the register R1 of the circuit Z' (step S111). The register R1 of the circuit Z and the register R1 of the circuit A judgment is made as to whether or not the logic is equivalent at the comparison points (registers R1) (step S113). When the decision is NO, non-equivalence at the comparison points (registers R1) is regarded as true non-equivalence (step S114). When the decision is YES, the register R2 of the circuit Z is compared with the register R2 of the circuit Z' (step S115).

A judgment is made as to whether or not the logic is equivalent at the comparison points (registers R2) (step S116).

When the decision is NO, a comparison is again made at the comparison points (registers R2) by using a condition that the register R1 of the circuit Z is not the register R1 of the circuit Z' (Z.R1=not Z'.R1) (step S117). When the decision is YES, non-equivalence at the comparison points (registers R1) is regarded as true non-equivalence (step S118).

A judgment is made as to whether or not the logic is equivalent at the comparison points (registers R2) (step S119).

When the decision is NO, non-equivalence at the comparison points (registers R1) is regarded as true non-equivalence (step S120). When the decision is YES, the non-equivalence at the comparison points (registers R1) is regarded as false non-equivalence (step S121). Therefore, the logic at the comparison points (registers R1) are equivalent to each other.

According to the third embodiment, the logical equivalency at different comparison points between the combinational circuits can be verified correctly by using the logic verification method which can be executed hierarchically.

The logic verification method and apparatus of the present invention execute logic verification in the low-hierarchically block and execute logic verification in the high-hierarchical circuit in a state that the low-hierarchical block is not subject to the comparison according to the logic verification method of verifying logical equivalence before and after a change of the circuit in which circuit information is composed hierarchical. Even if a number of comparison points in the low-hierarchical blocks increases due to the change of the circuit, the logical equivalence of the high-hierarchical circuits is verified by using the equivalence information of the comparison points. As a result, in the case where the logic verification is made in the circuit in which the circuit information (net list) is composed hierarchically, the whole circuit is not compared at a time. In other words, the low-hierarchical blocks are compared, and the high-hierarchical blocks are compared in a state that the compared low-hierarchical blocks are not subject to the comparison. This makes it possible to reduce execution time and the amount of memory used at the time of the execution. As a result, accurate result can be obtained in the circuit which is changed, and the coverage of the logic verification method can be widened.

Further, the logic verification method, of verifying the logical equivalence before and after the change of a circuit in which the circuit information is composed hierarchically, includes the step of making a judgment that a number of the input ports in the first and second low-hierarchical blocks is different so as to recognize that the second input port in the second low-hierarchical block is left, the step of executing backward retrieval from the second input port in the second low-hierarchical block based on the circuit information until the branch point is found, the step of finding the branch point as a result of the backward retrieval, the step of executing forward retrieval from the branch point when the branch point is found, the step of finding the first input port in the second low-hierarchical block as a result of the forward retrieval, the step of judging as to whether or not the first and second input ports in the second low-hierarchical block are equivalent logically to each other using the circuit information of the first and second input ports in the second low-hierarchical block, the step of, when the input ports are equivalent logically, regarding that the first and second input ports in the second low-hierarchical block are equal, and the step of, when they are not equivalent logically, returning to the step of executing the forward retrieval from the branch point. As a result, even if a number of the input ports in the low-hierarchical blocks increases more than the conventional logic verification method due to the change of the circuit, the logical equivalence of the circuits are compared. As a result, a change (inversion) of the logic of the circuit hardly occurs, and the logical equivalence of the high-hierarchical circuits can be verified correctly.

Further, the logic verification method, of verifying the logic equivalence before and after a change of the circuit in which the circuit information is composed hierarchically, includes: the step of, in the case where non-equivalence occurs at the first comparison points in the first and second low-hierarchical blocks, analyzing the non-equivalence at the first comparison points in the first and second low-hierarchical blocks; the step of finding second comparison points in the first and second low-hierarchical blocks as a cause of the non-equivalence; the step of inverting the second comparison points in the first and second low-hierarchical blocks so as to again compare the logic of the first comparison points in the first and second low-hierarchical blocks; the step of judging as to whether or not the logic is equivalent at the first comparison points in the first and second low-hierarchical blocks; the step of, when the first comparison points are not logically equivalent, regarding the non-equivalence at the first comparison points in the first and second low-hierarchical blocks as true non-equivalence; the step of, when the first comparison points are logically equivalent, creating information that the second comparison points in the first and second low-hierarchical blocks establish an inverted relationship so as to compare the logic in high-hierarchical blocks or in another equal-hierarchical blocks are compared at the second comparison points in the first and second low-hierarchical blocks using the information; the step of judging as to whether or not the logic is equivalent at the second comparison points in the first and second low-hierarchical blocks; the step of, when the logic is not equivalent, regarding the non-equivalence at the second comparison points in the first and second low-hierarchical blocks is true non-equivalence; and the step of, when the logic is equivalent, regarding the non-equivalence at the second comparison points in the first and second low-hierarchical blocks as false non-equivalence. As a result, the logical equivalence in the circuits is compared by using the logic verification method which can be executed hierarchically. For this reason, even if the logic in the circuits is inverted, the logical equivalence in the high-hierarchical circuits can be verified correctly.

Further, the logic verification method, of verifying the logical equivalence before and after a change of the circuit in which the circuit information is composed hierarchically, includes: the step of, when non-equivalence occurs at the first comparison points in the first and second equal-hierarchical blocks, inverting the first comparison points in the first and second equal-hierarchical blocks so as to compare them; the step of judging as to whether or not logic is equivalent at the first comparison points in the first and second equal-hierarchical blocks; the step of, when the logic is not equivalent, regarding the non-equivalence at the first comparison points in the first and second equal-hierarchical blocks as true non-equivalence; the step of, when the logic is equivalent, comparing second comparison points in the first and second equal-hierarchical blocks; the step of judging as to whether or not the logic is equivalent at the second comparison points in the first and second equal-hierarchical blocks; the step of, when the logic is not equivalent, again making a comparison at the second comparison points in the first and second equal-hierarchical blocks using a condition that the first comparison point in the first equal-hierarchical block is not the first comparison point in the second equal-hierarchical block; the step of, when the second comparison points are equivalent logically, regarding the non-equivalence at the first comparison points in the first and second equal-hierarchical blocks as true non-equivalence; the step of judging as to whether or not the logic is equivalent at the second comparison points in the first and second equal-hierarchical blocks; the step of, when the second comparison points are not equivalent logically, regarding the non-equivalence at the first comparison points in the first and second equal-hierarchical blocks as true non-equivalence; and the step of, when the second comparison points are equivalent logically, regarding the non-equivalence at the first comparison points in the first and second equal-hierarchical blocks as false non-equivalence. As a result, the logical equivalence can be verified correctly at the different comparison points in the combinational circuits by using the logic verification method which can be executed hierarchically.

Further, the logic verification apparatus, which verifies the logical equivalence before and after a change of the circuit in which the circuit information is composed hierarchically, includes means which executes a logic verification in the low-hierarchical block, executes a logic verification in the high-hierarchical circuit in a state that the low-hierarchical block is not the subject of comparison, and even if a number of comparison points in the low-hierarchical block increases due to the change of the circuit, verifies the logical equivalence in the high-hierarchical circuit using the equivalence information of the comparison points. As a result, in the case where a logic verification is made in a circuit in which the circuit information (net list) is composed hierarchically, a comparison is not made in the whole circuit at a time, but a comparison is made in the low-hierarchical block, and a comparison is made in the high-hierarchical block in a state that the low-hierarchical block where the comparison has been made is not the subject of the comparison. In this case, execution time and the amount of memory used at the time of the execution can be reduced, and a correct result can be obtained in the circuit which is changed, and the coverage of the logic verification apparatus can be widened.

Further, the logic verification apparatus, which verifies the logical equivalence before and after a change of the circuit in which the circuit information is composed hierarchically, includes means which verifies a logic according to the logic verification method of any one of the second to fourth aspects. As a result, in the case where the logic verification is made in the circuit where the circuit information (net list) is composed hierarchically, a comparison is not made in the whole circuit at time, but a comparison is made in the low-hierarchical blocks, and a comparison is made in the high-hierarchical blocks in a state that the low-hierarchical block where the comparison has been made is not the subject of the comparison. In this case, execution time and the amount of memory used at the time of the execution can be reduced, and a correct result can be obtained in the circuit which is changed, and the coverage of the logic verification apparatus can be widened.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A logic verification method verifying logical equivalence before and after a change of a circuit in which circuit information is arranged hierarchically, the method comprising:

judging that a number of input ports in first and second low-hierarchical blocks is different and recognizing that a second input port in the second low-hierarchical block has no counterpart in the first low-hierarchical block;

executing backward retrieval from the second input port in the second low-hierarchical block based on the circuit information until a branch point is found;

when the branch point is found, executing forward retrieval from the branch point;

finding a first input port in the second low-hierarchical block as a result of the forward retrieval;

judging whether the first and second input ports in the second low-hierarchical block are equivalent logically to each other using the circuit information of the first and second input ports in the second low-hierarchical block;

when the first and second ports are equivalent logically, regarding that the first and second input ports in the second low-hierarchical block are equal to each other; and when the first and second ports are not equivalent logically, returning to executing forward retrieval from the branch point.

2. A logic verification method verifying logical equivalence before and after a change of a circuit in which circuit information is arranged hierarchically, the method comprising:

when non-equivalence occurs at first comparison points in first and second low-hierarchical blocks, analyzing the non-equivalence at the first comparison points in the first and second low-hierarchical blocks;

finding second comparison points in the first and second low-hierarchical blocks as a cause of the non-equivalence;

inverting the second comparison points in the first and second low-hierarchical blocks and again comparing logic of the first comparison points in the first and second low-hierarchical blocks;

judging whether the logic is equivalent at the first comparison points in the first and second low-hierarchical blocks;

when the logic is not equivalent, regarding the non-equivalence at the first comparison points in the first and second low-hierarchical blocks as true non-equivalence;

when the logic is equivalent, creating information that the second comparison points in the first and second low-hierarchical blocks establish an inverted relationship to compare logic in one of a high-hierarchical block and another equal-hierarchical block at the second comparison points in the first and second low-hierarchical blocks using the information;

judging whether the logic is equivalent at the second comparison points in the first and second low-hierarchical blocks;

when the logic is not equivalent, regarding the non-equivalence at the second comparison points in the first and second low-hierarchical blocks as true non-equivalence; and when the logic is equivalent, regarding the non-equivalence at the second comparison points in the first and second low-hierarchical blocks as false non-equivalence.

3. A logic verification method verifying logical equivalence before and after a change of a circuit in which circuit information is arranged hierarchically, the method comprising:

when non-equivalence occurs at first comparison points in first and second equal-hierarchical blocks, inverting the first comparison points in the first and second equal-hierarchical blocks to make a comparison;

judging whether logic is equivalent at the first comparison points in the first and second equal-hierarchical blocks;

when the logic is not equivalent, regarding the non-equivalence at the first comparison points in the first and second equal-hierarchical blocks as true non-equivalence;

when the logic is equivalent, comparing second comparison points in the first and second equal-hierarchical blocks;

judging whether the logic is equivalent at the second comparison points in the first and second equal-hierarchical blocks;

when the logic is not equivalent, again comparing logic at the second comparison points in the first and second equal-hierarchical blocks using a condition that the first comparison point in the first equal-hierarchical block is not the first comparison point in the second equal-hierarchical block;

when the logic is equivalent, regarding the non-equivalence at the first comparison points in the first and second equal-hierarchical blocks as true non-equivalence;

judging whether the logic is equivalent at the second comparison points in the first and second equal-hierarchical blocks;

when the logic is not equivalent, regarding the non-equivalence at the first comparison points in the first and second equal-hierarchical blocks as true non-equivalence; and when the logic is equivalent, regarding the non-equivalence at the first comparison points in the first and second equal-hierarchical as false non-equivalence.

4. A logic verification apparatus comprising:

a unit which
   performs logic verification in a low-hierarchical block first;
   performs logic verification in a high-hierarchical circuit in a state that the low-hierarchical block is not the subject of comparison; and
   verifies logical equivalence in the high-hierarchical circuit, even if comparison points in the low-hierarchical block increase in number due to a changed circuit, using equivalence information of the comparison points;

means for judging that a number of input ports in first and second low-hierarchical blocks is different and recognizing that a second input port in the second low-hierarchical block has no counterpart in the first low-hierarchical block;

means for executing backward retrieval from the second input port in the second low-hierarchical block based on the circuit information until a branch point is found;

when the branch point is found, means for executing forward retrieval from the branch point;

means for finding a first input port in the second low-hierarchical block as a result of the forward retrieval;

means for judging whether the first and second input port in the second low-hierarchical block are equivalent logically to each other using the circuit information of the first and second input ports in the second low-hierarchical block;

when first and second ports are equivalent logically, means for regarding that the first and second input ports in the second low-hierarchical block are equal to each other; and when the first and second ports are not equivalent logically, means for returning to executing forward retrieval from the branch point.

5. A logic verification apparatus for verifying logical equivalence before and after a change of a circuit in which circuit information is arranged hierarchically, said apparatus comprising a unit which:

when non-equivalence occurs at first comparison points in first and second low-hierarchical blocks, means for analyzing the non-equivalence at the first comparison points in the first and second low-hierarchical blocks;

means for finding second comparison points in the first and second low-hierarchical blocks as a cause of the non-equivalence;

means for inverting the second comparison points in the first and second low-hierarchical blocks and again comparing logic of the first comparison points in the first and second low-hierarchical blocks;

means for judging whether the logic is equivalent at the first comparison points in the first and second low-hierarchical block;

when the logic is not equivalent, means for regarding the non-equivalence at the first comparison points in the first and second low-hierarchical blocks as true non-equivalence;

when the logic is equivalent, means for creating information that second comparison points in the first and second low-hierarchical blocks establish an inverted relationship to compare logic in one of a high-hierarchical block and another equal-hierarchical block at the second points in the first and second low-hierarchical blocks using the information;

means for judging whether the logic is equivalent at the second comparison points in the first and second low-hierarchical blocks;

when the logic is not equivalent, means for regarding the non-equivalence at the second comparison points in the first and second low-hierarchical blocks as true non-equivalence; and when the logic is equivalent, means for regarding the non-equivalence at the second comparison points in the first and second low-hierarchical blocks as false non-equivalence.

6. A logic verification apparatus for verifying logical equivalence before and after a change of a circuit in which circuit information is arranged hierarchically, said apparatus comprising:

when non-equivalence occurs at first comparison points in first and second equal-hierarchical blocks, means for inverting the first comparison points in the first and second equal-hierarchical blocks to make a comparison;

means for judging whether logic is equivalent at the first comparison points in the first and second equal-hierarchical blocks;

when the logic is not equivalent, means for regarding the non-equivalence at the first comparison points in the first and second equal-hierarchical blocks as true non-equivalence;

when the logic is equivalent, means for comparing second comparison points in the first and second equal-hierarchical blocks;

means for judging whether the logic is equivalent at the second comparison points in the first and second equal-hierarchical blocks;

when the logic is not equivalent, means for again comparing logic at the second comparison points in the first and second equal-hierarchical blocks using a condition that the first comparison point in the first equal-hierarchical block is not the first comparison point in the second equal-hierarchical block;

when the logic is equivalent, means for regarding the non-equivalence at the first comparison points in the first and second equal-hierarchical blocks as true non-equivalence;

means for judging whether the logic is equivalent at the second comparison points in the first and second equal-hierarchical blocks;

when the logic is not equivalent, means for regarding the non-equivalence at the first comparison points in the first and second equal-hierarchical blocks as true non-equivalence; and when the logic is equivalent, means for regarding the non-equivalence at the first comparison points in the first and second equal-hierarchical as false non-equivalence.

* * * * *